(12) United States Patent
Schroll

(10) Patent No.: US 8,070,315 B2
(45) Date of Patent: Dec. 6, 2011

(54) ILLUMINATION ARRANGEMENT, MULTIPLE LIGHT MODULE, LUMINAIRE AND USE THEREOF

(75) Inventor: Katrin Schroll, Matzing (DE)

(73) Assignee: OSRAM Gesellschaft mit beschränkter Haftung, München (DE)

( * ) Notice: Subject to any disclaimer, the term of this patent is extended or adjusted under 35 U.S.C. 154(b) by 883 days.

(21) Appl. No.: 12/009,544

(22) Filed: Jan. 17, 2008

(65) Prior Publication Data

US 2008/0212322 A1    Sep. 4, 2008

(30) Foreign Application Priority Data

Jan. 17, 2007  (DE) .................. 10 2007 002 403

(51) Int. Cl.
  *F21V 13/00*    (2006.01)
(52) U.S. Cl. ........ 362/243; 362/240; 362/241; 362/242; 362/246; 362/249.02; 362/296.02; 362/298; 362/311.02; 362/555; 362/558
(58) Field of Classification Search .................. 362/231, 362/236, 240–243, 246, 246.02, 296.02, 362/296.04, 298, 311.02, 311.06, 311.1, 362/311.14, 471, 555, 558, 558.9
See application file for complete search history.

(56) References Cited

U.S. PATENT DOCUMENTS

| | | | |
|---|---|---|---|
| 6,540,377 B1* | 4/2003 | Ota et al. ...................... | 362/231 |
| 7,152,985 B2* | 12/2006 | Benitez et al. ................ | 359/857 |
| 7,524,097 B2* | 4/2009 | Turnbull et al. .............. | 362/545 |
| 2004/0042212 A1* | 3/2004 | Du et al. ....................... | 362/296 |
| 2004/0080938 A1* | 4/2004 | Holman et al. ............... | 362/231 |
| 2005/0063063 A1* | 3/2005 | Ashdown ...................... | 359/599 |
| 2005/0168986 A1* | 8/2005 | Wegner ........................ | 362/241 |
| 2006/0012993 A1* | 1/2006 | Ohkawa ........................ | 362/240 |
| 2007/0002565 A1 | 1/2007 | Han et al. | |
| 2007/0211458 A1 | 9/2007 | Bertram et al. | |
| 2008/0002412 A1* | 1/2008 | Tanaka et al. ................. | 362/307 |
| 2009/0185394 A1* | 7/2009 | Takahashi ..................... | 362/613 |

FOREIGN PATENT DOCUMENTS

| | | |
|---|---|---|
| DE | 29707964 U1 | 8/1997 |
| DE | 20205818 U | 8/2003 |
| DE | 102005020908 A1 | 8/2006 |
| DE | 102005060334 A1 | 1/2007 |
| DE | 102006004581 A1 | 8/2007 |
| JP | 10308536 | 11/1998 |
| JP | 2001195904 | 7/2001 |
| WO | WO2007/053026 A1 | 5/2007 |

* cited by examiner

*Primary Examiner* — Diane Lee
*Assistant Examiner* — Mary Zettl
(74) *Attorney, Agent, or Firm* — Cozen O'Connor

(57) ABSTRACT

An illumination arrangement comprising a plurality of light-emitting semiconductor components (1), arranged in a row, a diffuser (2), which is illuminated by the light-emitting semiconductor components during operation of the illumination arrangement, intermixes light emitted by the semiconductor components during operation and has a light coupling-out area (200) remote from the semiconductor components, and two mutually opposite, reflective longitudinal side faces (3), between which the row of light-emitting semiconductor components is arranged, which run perpendicular or obliquely with respect to the light coupling-out area, and which reflect at least part of the light emitted by the light-emitting semiconductor components during operation in the direction toward the light coupling-out area.

31 Claims, 8 Drawing Sheets

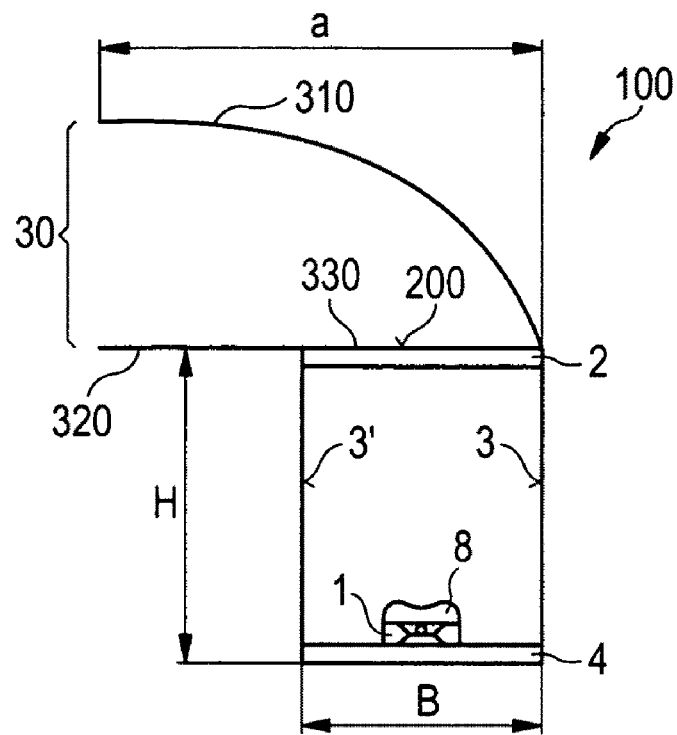
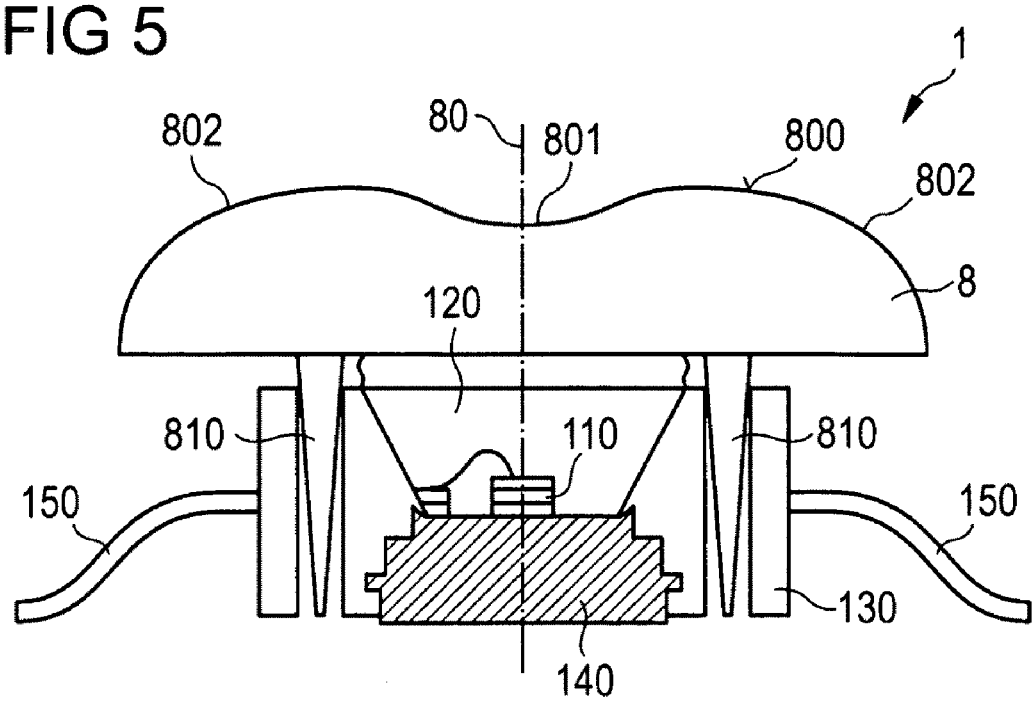

ILLUMINATION ARRANGEMENT, MULTIPLE LIGHT MODULE, LUMINAIRE AND USE THEREOF

RELATED APPLICATION

This patent application claims the priority of German patent application 10 2007 002 403. 9 filed Jan. 17, 2007, the disclosure content of which is hereby incorporated by reference.

BACKGROUND OF THE INVENTION

The present application relates to an illumination arrangement, a multiple light module, a luminaire and the use thereof.

One object of the present application is to provide an illumination arrangement which emits light having a particularly homogeneous luminance distribution, which light, in particular, can be optically imaged particularly well.

A further object of the present application is to provide a luminaire comprising an illumination arrangement of this type, a multiple light module and a use of the illumination arrangement, of the luminaire and of the multiple light module, respectively.

An illumination arrangement is specified. The illumination arrangement comprises a plurality of light-emitting semiconductor components arranged in a row, a diffuser, which is illuminated by the light-emitting semiconductor components during operation of the illumination arrangement, and two mutually opposite, reflective longitudinal side faces, between which the row of light-emitting semiconductor components is arranged.

The diffuser intermixes light emitted by the semiconductor components during operation. In particular, it scatters light emitted by the semiconductor components during operation. It has a light coupling-out area remote from the semiconductor components. The two mutually opposite, reflective longitudinal side faces run perpendicular or obliquely with respect to the light coupling-out area of the diffuser and reflect at least part of the light emitted by the light-emitting semiconductor components during operation in the direction toward the light coupling-out area.

In the context of the present application, the expression "arranged along a row" encompasses in particular embodiments in which the light-emitting semiconductor components succeed one another in a main extension direction. By way of example, the light-emitting semiconductor components are arranged linearly or as a zigzag chain. An arrangement of the light-emitting semiconductor components along an (imaginary) curved line is also conceivable.

In one advantageous configuration, the illumination arrangement has two mutually opposite transverse side faces, which run perpendicular or obliquely with respect to the longitudinal side faces and the light coupling-out area, and a carrier opposite the diffuser.

The transverse side faces, the longitudinal side faces, the diffuser and the carrier preferably partly or completely enclose an interior space in which the light-emitting semiconductor components are arranged. To put it another way, the transverse side faces, the longitudinal side faces, the diffuser and the carrier form a luminous box with an interior space in which the light-emitting semiconductor components are arranged. The longitudinal side faces and/or the transverse side faces are preferably arranged perpendicular to the light coupling-out area; by way of example, the luminous box is a parallelepiped.

In one advantageous configuration, the longitudinal side faces are formed in diffusely reflective fashion. The reflectance of the longitudinal side faces, at least for the light which is emitted by the light-emitting semiconductor components and impinges on the longitudinal side face, is preferably greater than 90% and particularly preferably greater than 94%.

With the illumination arrangement, a particularly homogeneous luminance distribution can advantageously be obtained at the light coupling-out area of the diffuser.

In one preferred configuration, at least one of the light-emitting semiconductor components comprises an optical device, in particular a lens, which has a radiation exit area having a concavely curved partial region and a convexly curved partial region, which at least partly surrounds the concavely curved partial region. Preferably, the optical device has an optical axis which particularly preferably runs through the concavely curved partial region of the radiation exit area. In one advantageous configuration, the radiation exit area is embodied rotationally symmetrically with respect to the optical axis.

The intensity of the light which is emitted by the semiconductor component during operation and which is emitted from the semiconductor component at an angle to the optical axis is advantageously increased in comparison with the intensity of the light which is essentially emitted along the optical axis. The area illuminated by the light-emitting semiconductor component is advantageously enlarged with the optical device. Preferably, the maximum angle of emergence of light from the semiconductor component with respect to the optical axis is at least almost 90°. The number of semiconductor components which illuminate a predetermined location of the diffuser and/or of a longitudinal side face is therefore particularly large if one of the light-emitting semiconductor components, but preferably a plurality, in particular all, of the light-emitting semiconductor components have such an optical device. In this way, the number of light-emitting semiconductor components whose light is superimposed at a location of the diffuser is advantageously increased, such that the light emitted by the light coupling-out area is particularly homogeneous.

In a further configuration of the illumination arrangement, the illumination arrangement comprises a light-emitting semiconductor component which during operation, emits light having a spectral distribution which brings about a red, orange, yellow, green, blue or white color impression.

In one advantageous configuration, a first one of the light-emitting semiconductor components emits light having a first spectral distribution during operation, and a second one of the light-emitting semiconductor components, which is adjacent to the first semiconductor component, emits light having a second spectral distribution, which is different from the first spectral distribution, during operation.

In one advantageous development of this configuration, the illumination arrangement comprises at least one group of four light-emitting semiconductor components succeeding one another along the row, said group comprising one semiconductor component which emits red light, one which emits green light, one which emits blue light and one which emits white light. A particularly high color rendering quality, for instance a particularly high color rendering index, is obtained in this way. As an alternative, the semiconductor component emitting white light can also be omitted, such that each group has only three light-emitting semiconductor components.

In particular, the diffuser or the diffuser and the diffusely reflective longitudinal side faces intermix advantageously light from a plurality of the light-emitting semiconductor components which emit light having different spectral distributions, for example light of the first and of the second semiconductor component or light from at least two, but preferably all, semiconductor components of the group of light-emitting semiconductor components succeeding one another along the row.

In one advantageous configuration, the chromaticity coordinate of the light emitted by the light coupling-out area is adjustable, in particular by means of the energization of the light-emitting semiconductor components. The chromaticity coordinate is the color impression of the emitted light as represented in the CIE standard calorimetric system of the Commission Internationale de l'Eclairage of 1931.

In intermixing of the light emitted by the light-emitting semiconductor components is advantageously obtained by means of the reflective longitudinal side faces, by means of the diffuser and, if appropriate, also by means of the optical device(s), such that the light emitted by the light coupling-out area has a uniform chromaticity coordinate.

In a further advantageous configuration, the illumination arrangement has, at least one end of the row of light-emitting semiconductor components, a transverse side face which is illuminated by at least the semiconductor component arranged at the end of the row and which is intentionally formed such that it is absorbent for a light emitted by the semiconductor component.

The transverse side face which is intentionally formed such that it is absorbent reflects for example 30% or less, preferably 15% or less, particularly preferably 5% or less, of the light which is emitted by the semiconductor components and impinges on said side face. By way of example, the absorbent transverse side face is an area of an absorber which is produced from a dark, in particular black, material or a dark, in particular black, material composition or is provided with such a material or material composition.

In addition or as an alternative, in a further advantageous configuration, the reflectivity of at least one of the longitudinal side faces in an edge region of the illumination arrangement is lower than the reflectivity of the longitudinal side face in a central region of the illumination arrangement. The edge region comprises in particular the absorbent transverse side face. By way of example, the reflective longitudinal side face in the central region of the illumination arrangement has a reflectivity of 90% or more, preferably of 94% or more. In the edge region, a minimum reflectivity of the longitudinal side face is less than or equal to 50%, preferably less than or equal to 30%, particularly preferably less than or equal to 15%. In one advantageous development, the reflectivity of the longitudinal side face in the edge region increases continuously or in stepped fashion in the direction toward the central region.

By way of example, the longitudinal side face is provided with an absorbent material or an absorbent material composition in the edge region. In one advantageous configuration, the absorbent material or the absorbent material composition is applied in the form of absorbent structural units. Preferably, the density and/or the size of the absorbent structural units in the edge region decreases continuously or in stepped fashion in the direction toward the central region. The structural units can, for example, be dots (like circles and/or squares) and/or stripes.

Expediently, at least one of the light-emitting semiconductor components, preferably a plurality of the light-emitting semiconductor components, for example two or three semiconductor components, but in particular not more than five semiconductor components, is/are arranged in the edge region.

The absorbent transverse side face and/or the longitudinal side face(s) having a reduced reflectivity in the edge region reduce the risk of light from the light-emitting semiconductor components arranged in the edge region not being sufficiently intermixed with light from other semiconductor components, which are arranged for example in the central region. In particular, the risk of the color impression of the light emitted by the illumination arrangement in the edge region deviating from the color impression of the light emitted by the illumination arrangement in the central region is reduced. To put it another way, the risk of the occurrence of a so-called color fringe in the edge region of the illumination arrangement is reduced.

Preferably, the value and/or the change of the reflectivity of the longitudinal side face in the edge region is adapted to the luminous flux emitted by the semiconductor component(s) arranged in the edge region during operation.

In one advantageous configuration, the light emitted by the light coupling-out area of the illumination arrangement has an at least approximately Lambertian intensity distribution. In particular, in the case of a Lambertian intensity distribution, the luminance is independent of the viewing direction. In this case, the luminous intensity decreases with the cosine of the angle between viewing direction and surface normal of the light coupling-out area.

In a further advantageous configuration, the light emitted by the illumination arrangement essentially has the same chromaticity coordinate at every location of the light coupling-out area; in particular, no local variation and/or fluctuation of the chromaticity coordinate of the light coupling-out area can be resolved by the human eye.

In a further advantageous configuration, the illumination arrangement has a beam shaping device disposed downstream of the light coupling-out area. The beam shaping device comprises for example a lens, a reflector, in particular a mirror, and/or a diffraction grating. Preferably, the beam shaping device has a cylinder- or cylinder-segment-shaped geometry. In one configuration, the center axis of the cylinder is running parallel to the light coupling-out area and preferably also parallel to the row of the light-emitting semiconductor components. The beam shaping device preferably alters the angular distribution of the radiation emitted by the light coupling-out area.

The illumination arrangement can contain at least one further light-emitting semiconductor component which is not arranged in the row. By way of example, two or more rows of light-emitting semiconductor components run parallel to one another. Preferably, however, the illumination arrangement has a larger number of light-emitting semiconductor components in a direction of the row than a direction perpendicular to the row. It then has the form of a light string. In one configuration, a plurality of illumination arrangements are arranged in a series in order to extend the light string. In addition or alternatively, a plurality of illumination arrangements are arranged alongside one another in a direction perpendicular or obliquely to the main direction of extension of the row of semiconductor components. In particular, they constitute a multiple light module comprising a plurality of illumination arrangements strung together and/or arranged alongside one another as individual light modules.

In one advantageous configuration of the invention, a luminaire has at least one such illumination arrangement. The illumination arrangement is particularly well suited to a luminaire since the light emitted by the light coupling-out area can be optically imaged particularly simply and flexibly. By way of example, the luminaire is a ceiling luminaire, a spotlight, for example a floodlight, a table luminaire or a headlight.

The illumination device or the luminaire is suitable for example for the direct or indirect illumination of a room, for instance for the interior illumination of a transport means, in particular of an aircraft cabin, or of a company building.

BRIEF DESCRIPTION OF THE DRAWINGS

Advantageous embodiments and developments of the illumination arrangement, the luminaire and the use thereof will become apparent from the exemplary embodiments described below in association with FIGS. 1 to 12.

FIG. 4 shows a schematic cross section through an illumination arrangement in accordance with a fourth exemplary embodiment, FIG. 5 shows a schematic cross section through a light-emitting semiconductor component.

DETAILED DESCRIPTION OF THE DRAWINGS

Figure 1:
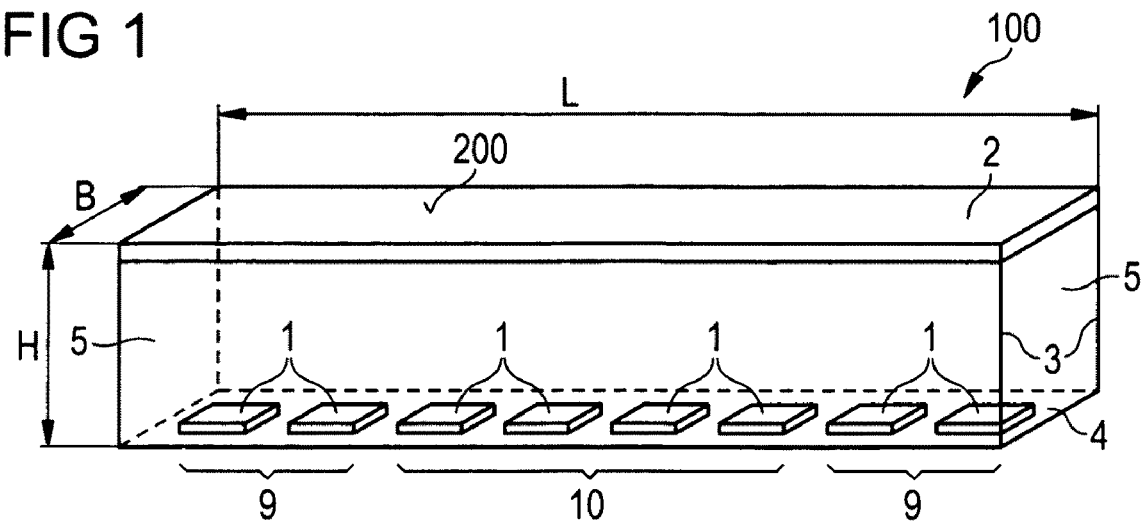
FIG. 1 shows a schematic perspective view of an illumination arrangement in accordance with a first exemplary embodiment.
Figure 2:
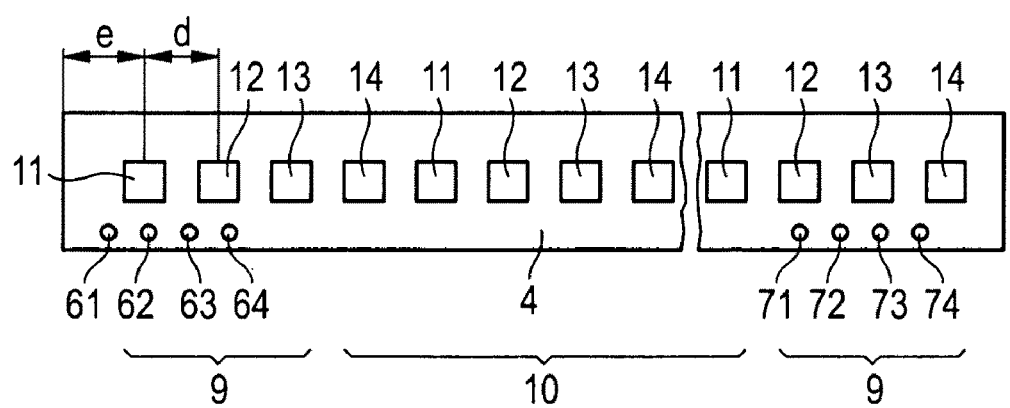
FIG. 2 shows a schematic plan view of a carrier with a plurality of light-emitting semiconductor components of an illumination arrangement in accordance with a second exemplary embodiment.

In the exemplary embodiments and Figures, similar or similarity acting constituent parts are provided with the same reference symbols. The elements illustrated in the Figures and their size relationships among one another should not be regarded as true to scale. Rather, individual elements may be represented with an exaggerated size for the sake of better representability and/or for the sake of better understanding.

The illumination arrangement 100 in accordance with the first exemplary embodiment comprises a luminous box with an interior space that is laterally delimited by two longitudinal side faces 3 and two transverse side faces 5. The longitudinal side faces 3 are parallel to one another. The transverse side faces 5 are arranged essentially perpendicular to the longitudinal side faces 3 and parallel to one another.

A carrier 4 is arranged at the bottom of the interior space of the luminous box, a plurality of light-emitting semiconductor components 1 being arranged on said carrier. By way of example, the carrier 4 delimits the luminous box at its backside.

A diffuser 2 is arranged, preferably parallel to the carrier 4, on the top side of the luminous box opposite the bottom. The diffuser has a light coupling-out area 200, which is remote from the light-emitting semiconductor components 1 and through which light is emitted from the illumination arrangement 100.

In the present case, the longitudinal side faces 3 and the transverse side faces 5 run perpendicular to the light coupling-out area 200 and to the main extension plane of the carrier 4. As an alternative embodiment it is conceivable for the longitudinal side faces 3 and/or transverse side faces to run obliquely with respect to one another and/or obliquely with respect to the carrier 4 and/or with respect to the light coupling-out area 200. By way of example, the distance between the longitudinal side faces and/or the distance between the transverse side faces can increase in a direction from the carrier 4 toward the light coupling-out area 200. The light coupling-out area then has, in particular, a larger area than a main face of the carrier 4.

The longitudinal side faces 3 are matt white, diffusely reflective areas. By way of example, the longitudinal side faces 3 are the inner faces of side walls of the luminous box which face the semiconductor components 1. At least one side wall has for example a plate composed of a diffusely reflective material, for example an, in particular white, plastic material. As an alternative, the side walls can have a so-called "Light Enhancement Film" at their side facing the interior space. A Light Enhancement Film is a film which has a high reflection capability and a low light absorption. It is available from the 3M Company. Preferably, the Light Enhancement Film is diffusely reflective, in particular with an at least almost Lambertian emission characteristic. The Light Enhancement Film is preferably fixed, for example adhesively bonded, to the plate.

The reflection capability of the reflective longitudinal side faces in the present case is between 94% and 95%, the limits being included.

In the case of the illumination arrangement 100 in accordance with the first exemplary embodiment, the transverse side faces 5 are embodied in diffusely reflective fashion, analogously to the longitudinal side faces 3.

The light-emitting components 1 are arranged along a row on the carrier, said row running parallel to the side walls. By way of example, the light-emitting semiconductor components 1 all emit light having an, at least nominally, identical spectral distribution. For example, all light-emitting semiconductor components 1 emit white light.

The length L of the luminous box, that is to say the extent of the luminous box in a direction of the row of light-emitting semiconductor components, is 30 cm in the present case. The width of the luminous box—to put it another way the extent perpendicular to the direction of the row—is 1 cm in the first exemplary embodiment. The height of the luminous box is 3 cm, for example. The luminous box therefore has a larger extent in a direction of the row of light-emitting semiconductor components 1 than perpendicular thereto: L>B. Preferably, the length L is at least ten times as large as the width B (L≧10·B), particularly preferably at least twenty times as large (L≧20·B). In the present case, the length L is thirty times as large as the width B.

The light-emitting semiconductor components 1 used are for example high-power light-emitting diodes. In particular, the light-emitting semiconductor components 1 have a light-emitting front side and are surface-mountable, in particular at their rear side opposite the light-emitting front side. One example of such a surface-mountable high-power light-emitting diode 1 is schematically illustrated in cross section in FIG. 5.

The light-emitting semiconductor component 1 has at least one light-emitting semiconductor chip 110 composed of an inorganic semiconductor material which is arranged in a cut-out 120 of a basic housing 130. As an alternative, organic light-emitting semiconductor components 1 are also suitable which have an active, photon-emitting zone containing for example a polymer and/or a material of low molecular weight ("small molecules").

The cavity 120 is delimited by a thermal connection part 140 at its side remote from the light-emitting front side, said connection part extending as far as the rear side of the housing basic body 130. The light-emitting semiconductor chip(s) 110 is/are electrically and thermally conductively fixed on the thermal connection part 140. Electrical connection elements 150 project from the longitudinal side faces of the basic housing 130. In the present case they are bent to form wing-type connection stubs. As an alternative, they can be bent around the basic housing 130 toward the rear side thereof. A particularly efficient dissipation of heat from the light-emitting semiconductor chip 110 is obtained by means of the thermal connection part 140 embodied separately from the electrical connection elements 150.

The electrical power consumed by the light-emitting semiconductor component 1 is preferably greater than or equal to 1 W. The carrier 4 is preferably a metal-core circuit board, by means of which a particularly efficient heat dissipation is obtained.

The light-emitting semiconductor component 1 illustrated in FIG. 5 also has an optical device 8, in the present case a lens element, which contains or comprises for example a silicone material and/or an epoxy resin molded material.

The lens element 8 has a radiation exit area 800, through which at least part of the light generated by the semiconductor chip 110 is emitted. The radiation exit area 800 is formed rotationally symmetrically about an optical axis 80, which in the present case also runs through the semiconductor chip 110. A concave partial region 801 of the radiation exit area 800 contains the optical axis 80. A convexly curved partial region 802 of the radiation exit area 800 surrounds the concavely curved partial region 801 in ring-shaped fashion.

At its side facing the housing basic body 130, the lens element 8 has a holding device 810, which is embodied for example in the form of one or more pins and/or clamps, and by which the lens element 8 is fixed at or in the basic body 130 of the semiconductor component 1.

Such a light-emitting semiconductor component is described in principle in the document DE 102005020908 A1 which corresponds to co-pending U.S. patent application Ser. No. 11/814,595, the disclosure content of both of which is hereby incorporated by reference.

The illumination arrangement 100 in accordance with a second exemplary embodiment differs from the illumination arrangement 100 in accordance with the first exemplary embodiment by virtue of the fact that it comprises a plurality of groups of light-emitting semiconductor components 1. In the present case, each group comprises four semiconductor components 1 which are succeeding one another along the row and of which a first semiconductor component 11 emits light having a first spectral distribution, which generates a red or orange color impression, a second semiconductor component 12 emits light having a second spectral distribution, which generates a green color impression, a third semiconductor component 13 emits light having a third spectral distribution, which generates a blue color impression, and the fourth semiconductor component 14 emits light having a fourth spectral distribution, which generates a white color impression. By way of example, the four light-emitting semiconductor components 11, 12, 13 and 14 succeed one another in the specified order along the row.

The disclosed arrangement is restricted neither to this order nor to this number of light-emitting semiconductor components 11, 12, 13, 14 per group. By way of example, groups comprising three light-emitting semiconductor components, for example a red, a green and a blue semiconductor component 11, 12, 13, are also possible.

In the present case, each of the light-emitting semiconductor components 1 is assigned to one of the groups. As an alternative, it is also conceivable that, in addition to the group or groups, one or a plurality of light-emitting semiconductor components 1 is/are present not belonging to any group.

In the present case, all the first semiconductor components 11, all the second semiconductor components 12, all the third semiconductor components 13 and all the fourth semiconductor components 14 are in each case connected in series and are connected by means of, respectively, a positive and a negative electrical connection 61/71, 62/72, 63/73 and 64/74 in each case to a power supply device that feeds a suitable operating current to the light-emitting semiconductor components 11, 12, 13, 14.

By way of example, the illumination arrangement 100 comprises six groups of light-emitting semiconductor components, the respectively mutually proximate semiconductor components 11 and 12, 12 and 13, 13 and 14, and 14 and 11, in the present case each having the same distance d=12.5 mm. The distance between the first and last semiconductor component 11 and 14, respectively, of the row and the adjacent edge of the carrier 4 in the row direction is e=6.25 mm in the present case. The centroids of the light-emitting semiconductor components 1 are crucial in each case for the measurement of the distances.

The illumination arrangement 100 in accordance with the second exemplary embodiment therefore comprises six first, six second, six third and six fourth semiconductor components 11, 12, 13 and 14, respectively. The first semiconductor components 11 are operated with an operating current of 400 mA, for example, the second and third semiconductor components 12, 13 are operated in each case with an operating current of 350 mA, for example, and the fourth semiconductor components 14 are operated with an operating current of 500 mA, for example. Each of the first, second and fourth semiconductor components 11, 12 and 14 emits for example light having a luminous flux of approximately 60 lm. Each of the third semiconductor components 13 emits light having a luminous flux of 20 lm, for example. The entire illumination arrangement 100 therefore supplies for example a luminous flux of approximately 1200 m.

Figure 6A:
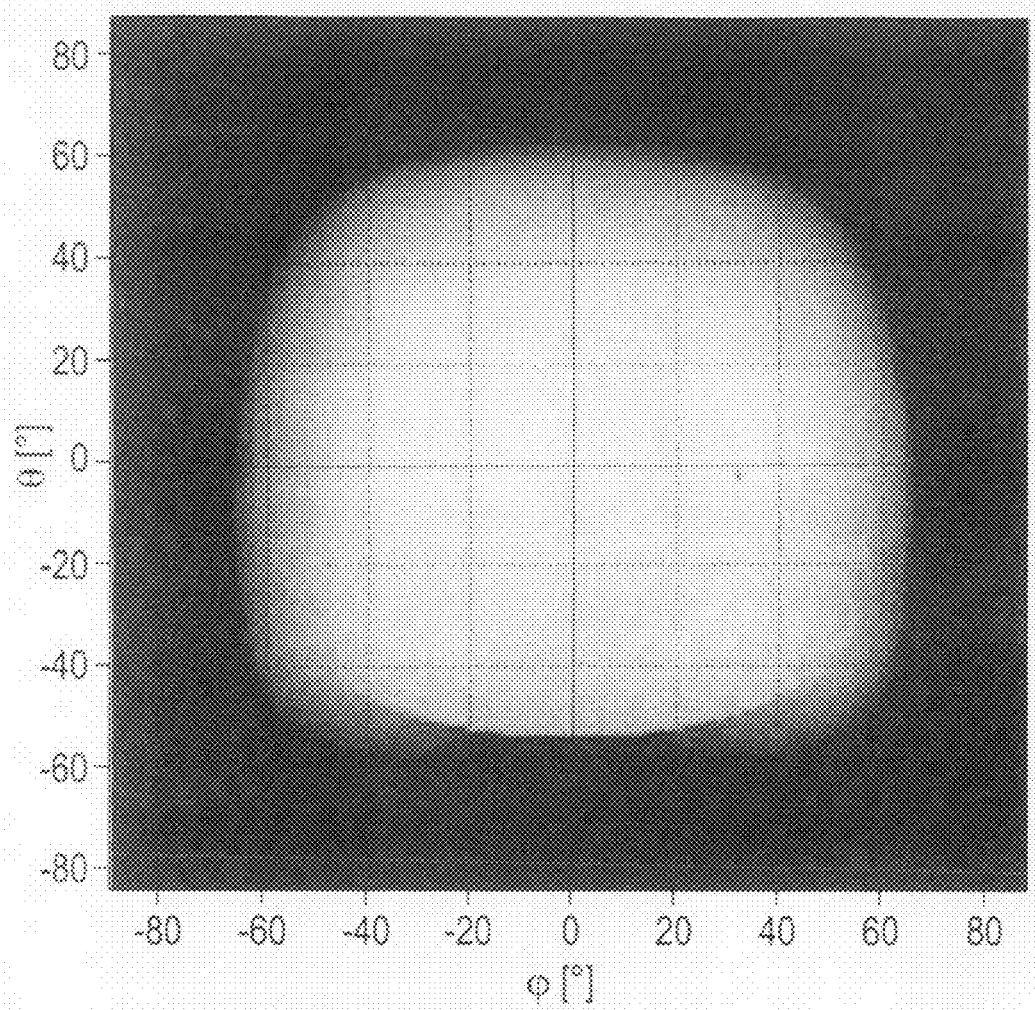
FIG. 6A shows the relative illuminance brought about by the light-emitting semiconductor components of the second exemplary embodiment.
Figure 6B:
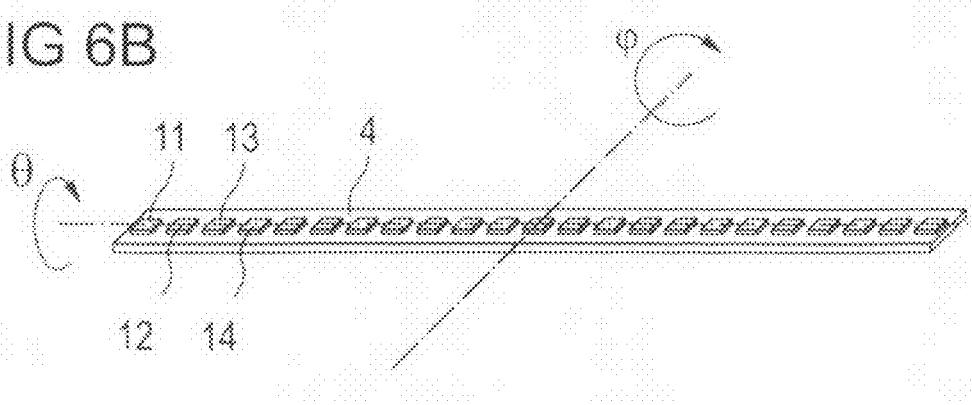
FIG. 6B shows a schematic perspective view of the light-emitting semiconductor components bringing about the relative illuminance of FIG. 6A.

In FIG. 6A, measured values for the relative illuminance brought about by the semiconductor components 11, 12, 13, 14 in accordance with the second exemplary embodiment are represented in arbitrary units as a function of the viewing angles $\phi$ and $\theta$ for the situation when the semiconductor components 11, 12, 13, 14 are arranged on the carrier 4, for example on a plane area, and when the reflective longitudinal side faces 3, the transverse side faces 5, and also the diffuser 2 are omitted. The viewing angles $\phi$ and $\theta$ are shown in FIG. 6B. A viewing angle $\phi=0°$, $\theta=0°$ corresponds to a plan view along the surface normal of the main extension plane of the carrier 4. A high proportion of the light is emitted at large angles with respect to the area normal.

Figure 7A:
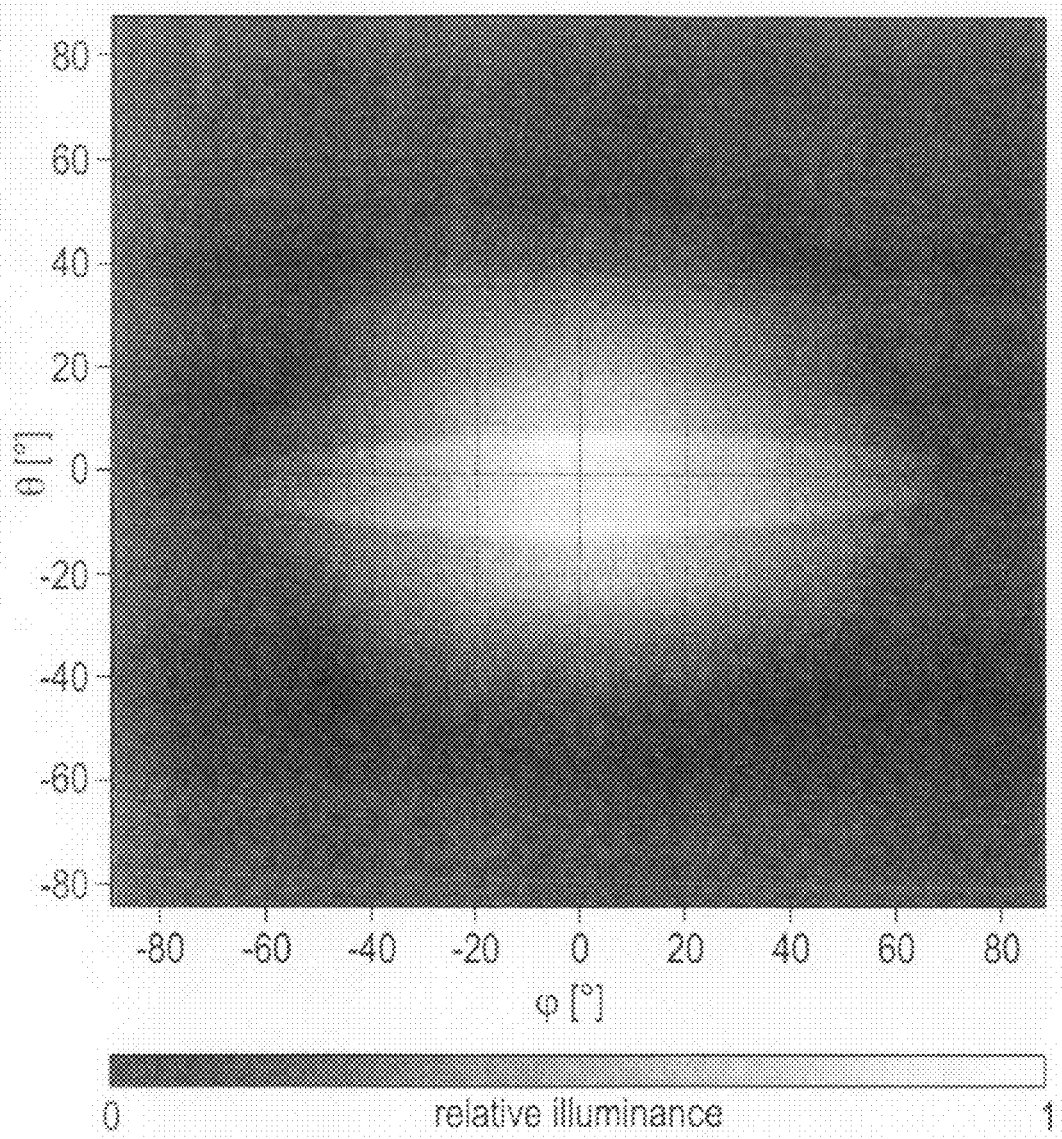
FIG. 7A shows the relative illuminance of the semiconductor components of the second exemplary embodiment in the presence of the reflective side walls.
Figure 7B:
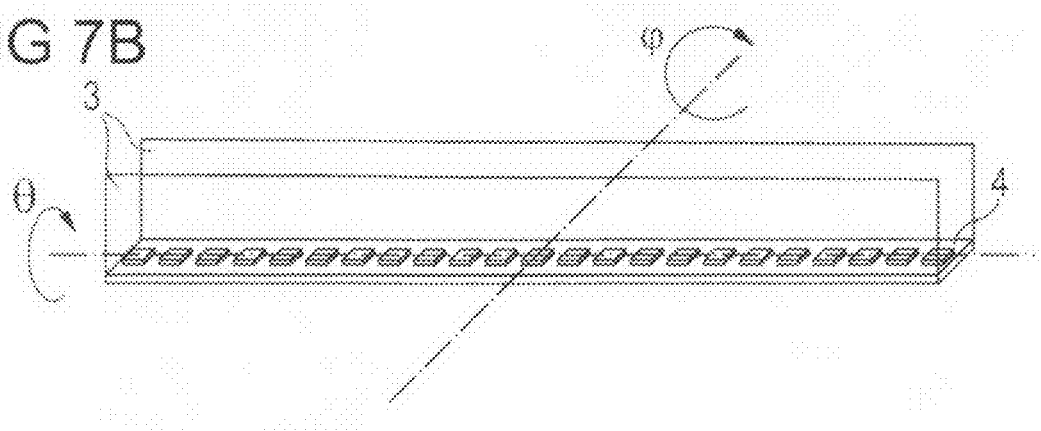
FIG. 7B shows a schematic perspective view of the light-emitting semiconductor components and sidewalls bringing about the relative illuminance of FIG. 7A.

The relative illuminance in the presence of the diffusely reflective longitudinal side faces 3 is represented in FIG. 7A. Said faces already considerably improve the emission characteristic for the $\theta$ direction. The viewing angles $\phi$ and $\theta$ with respect to the side faces 3 are shown in FIG. 7B.

Figure 8A:
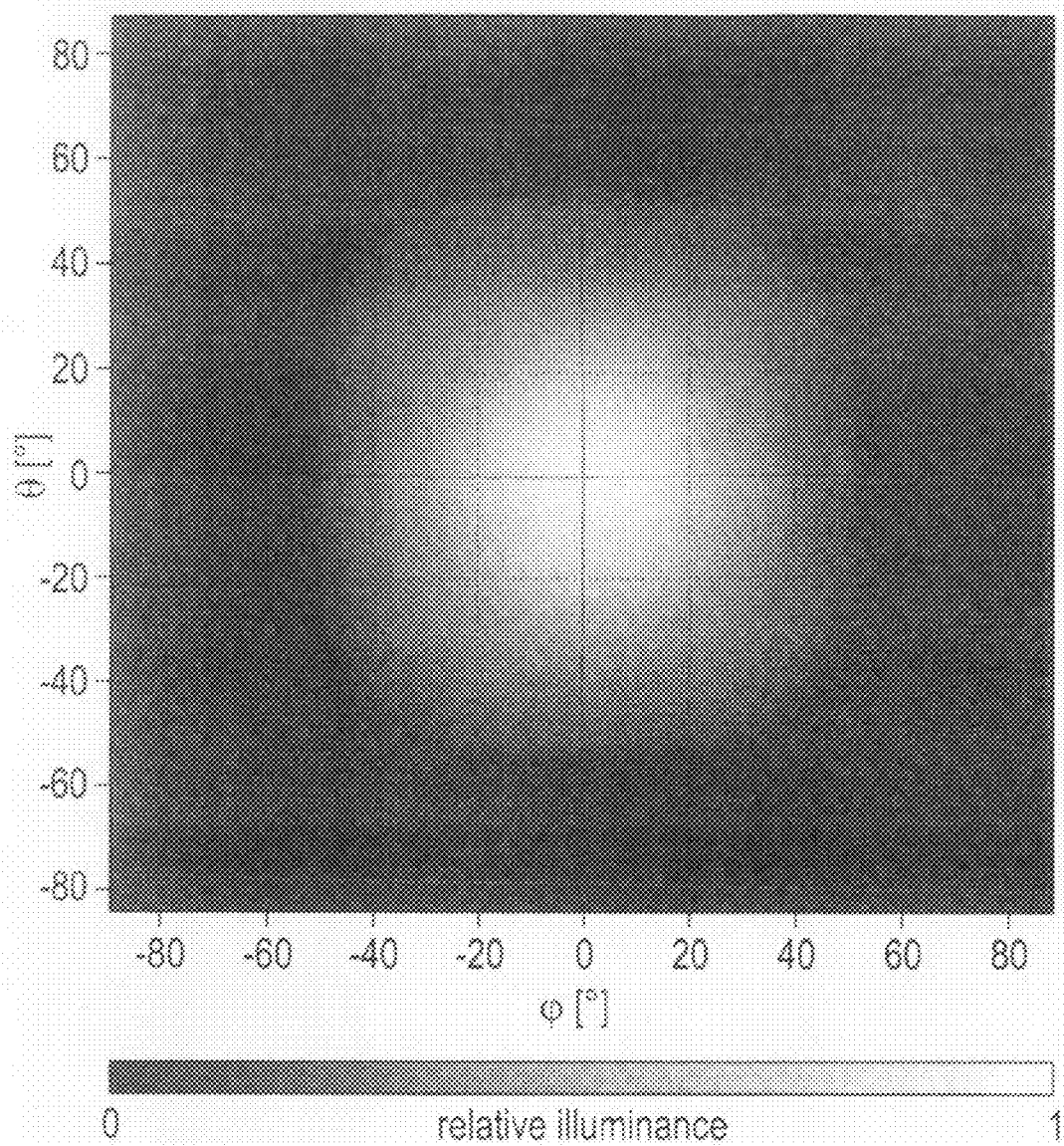
FIG. 8A shows the relative illuminance of the illumination arrangement in accordance with the second exemplary embodiment.
Figure 8B:
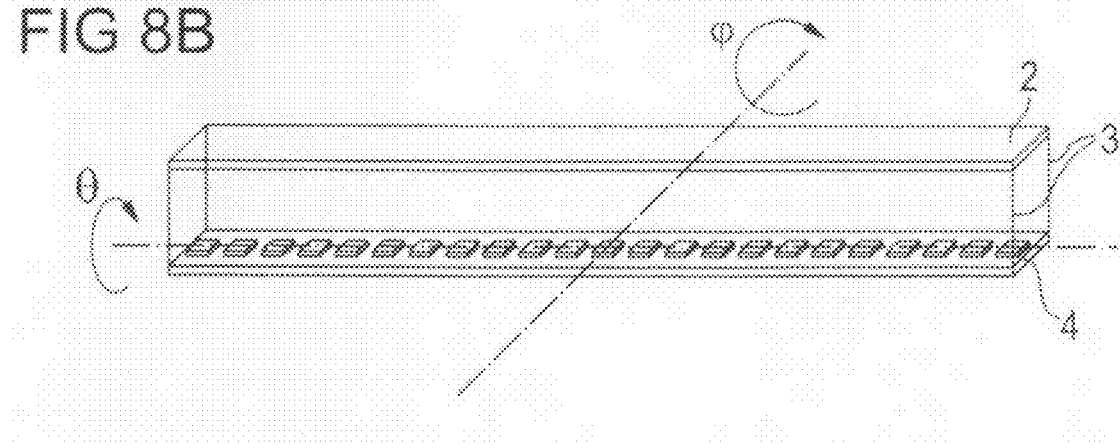
FIG. 8B shows a schematic perspective view of the illumination arrangement bringing about the relative illuminance of FIG. 8A.

FIG. 8A shows the corresponding relative illuminance of the complete illumination arrangement 100 of the second exemplary embodiment including diffuser 2. The respective viewing angles $\phi$ and $\theta$ of FIG. 8A are shown in FIG. 8B. With the lens elements 8, the diffusely reflective longitudinal side faces 3 and the diffuser 2 together an at least almost Lambertian emission characteristic is obtained in which the illuminance decreases with the cosine of the viewing angle $\phi$ or $\theta$, respectively.

The illumination arrangement 100 in accordance with a third exemplary embodiment differs from the illumination arrangement 100 in accordance with the second exemplary embodiment by virtue of the fact that the transverse side faces 5 are embodied in absorbent fashion, such that light which is emitted by the semiconductor components 11, 12, 13, 14 and impinges on the transverse side faces 5 is at least partly absorbed. By way of example, the transverse side faces are printed with a material containing a black dye, blackened with carbon black, or have an absorbent, for example a matt black, film adhesively bonded on them.

Moreover, in edge regions 9 of the illumination arrangement 100, absorbent structures 90 are arranged at the longitudinal side faces 3. Each of the longitudinal side faces 3 therefore has absorbent structures 90 at both ends. In a central region 10 of the illumination arrangement 100, which is arranged between the edge regions 9, the longitudinal side faces 3 are free of such absorbent structures 90 in the present exemplary embodiment.

Figure 3:
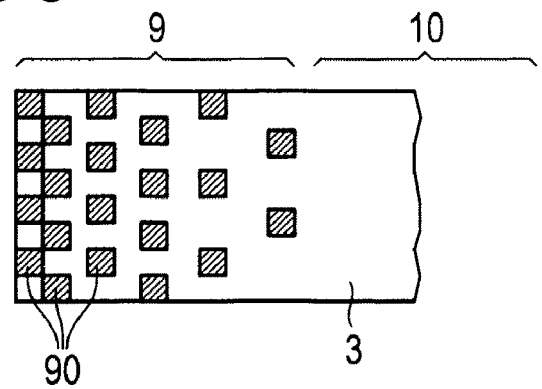
FIG. 3 shows a schematic plan view of a partial region of a longitudinal side face of an illumination arrangement in accordance with a third exemplary embodiment.

This is schematically illustrated in FIG. 3 for one of the edge regions 9 in a plan view of a longitudinal side face 3 as seen from the interior space of the luminous box.

By way of example, the absorbent structural units 90 are applied by printing or adhesive bonding. In the present case, the absorbent structural units 90 are rectangles or squares. However, the absorbent structural units 90 are not restricted to these forms. Absorbent structural units which are for example circular, elliptical, triangular or other polygonal areas or structural units in which circular, elliptical, polygonal, in particular triangular and/or rectangular, and/or differently shaped partial areas are cut out from an absorbent area, the reflective longitudinal side face 3 not being covered in said partial areas, are also conceivable.

In the case of the illumination arrangement 100 in accordance with the third exemplary embodiment, the density of the absorbent structural units 90 in the edge region 9 decreases in a direction toward a central region of the illumination arrangement 100 arranged between the edge regions 9.

To put it another way, the number of absorbent structural units 90 in a partial zone of the edge region 9 that is adjacent to the central region 10 is lower than the number in a partial region of the edge region 9 that is remote from the central region 10. As an alternative or in addition, the size of the absorbent structural units can also decrease in a direction toward the central region 10 and/or the number and/or size of the regions of the longitudinal side face 3 that are left free of the absorbent area can increase in a direction of the central regions.

The illumination arrangement 100 in accordance with the fourth exemplary embodiment illustrated in FIG. 4 corresponds to the illumination arrangement 100 in accordance with the second exemplary embodiment. However, it additionally has a beam shaping device 30, which alters the emission direction and the illuminance distribution of the light emitted by the light coupling-out area 200.

The beam shaping device 30 has a cylinder-segment-like form, the axis of the cylinder running in the direction of the row of the light-emitting semiconductor components 1. The cylinder has an elliptical cross section, for example. The optical device comprises a first mirror 310, which runs along an outer area of the imaginary cylinder, and a second mirror 320, which is a plane mirror and runs for example in a plane spanned by the cylinder axis and a major axis of the ellipse.

The first mirror 310 extends, for example, a first one of the longitudinal side faces 3. To put it another way, the first mirror 310 has an edge which is adjacent to the first longitudinal side face 3 and which runs in or at least parallel to a plane defined by the first longitudinal side face 3. In a direction of the width B, the beam shaping device 30 projects beyond the second longitudinal side face 3' in the present case. In particular, the second mirror 320 is arranged at least partly laterally beside the luminous box, to be precise at the side remote from the first longitudinal side face 3. By way of example, the beam shaping device 30 has a width a=45 mm.

The second mirror 320 preferably runs parallel to the light coupling-out area 200 and has an opening 330 through which the light emitted by the light coupling-out area 200 is coupled into the beam shaping device 30.

The beam shaping device in accordance with the fourth exemplary embodiment effects a rotation of the main emission direction, that is to say in particular of the direction in which light is emitted by the illumination arrangement 100 with maximum intensity, through approximately 90° about an axis parallel to the row of semiconductor components 1.

Figure 9A:
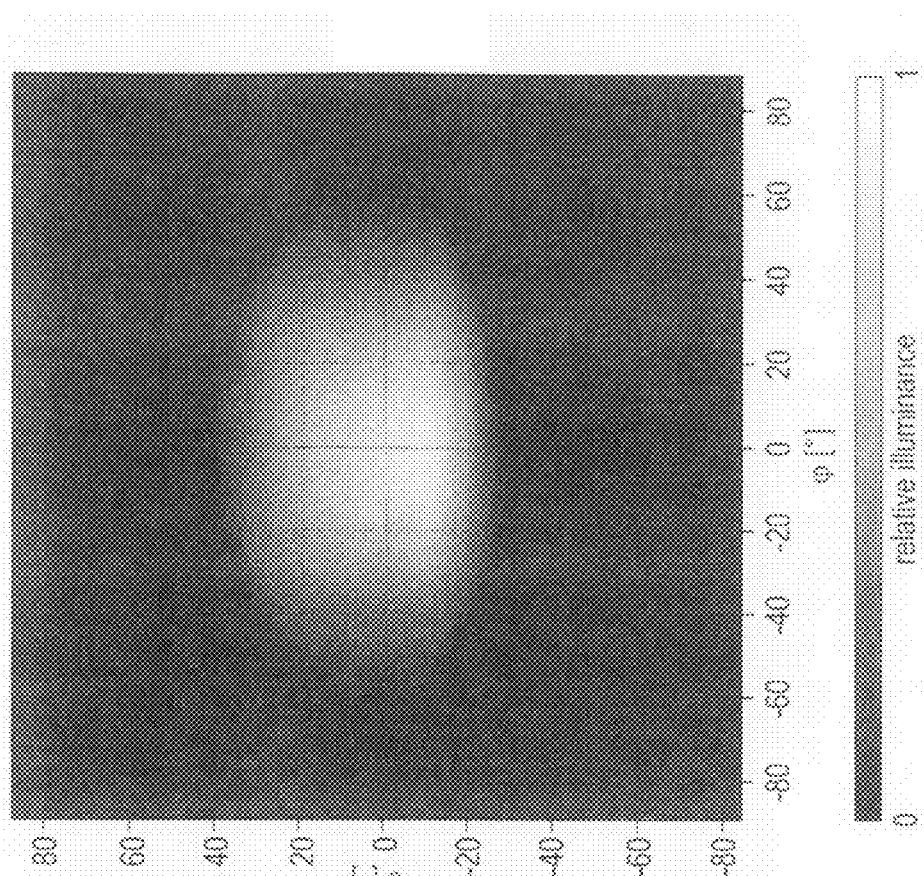
FIG. 9A shows the relative illuminance of the illumination arrangement in accordance with the fourth exemplary embodiment.
Figure 9B:
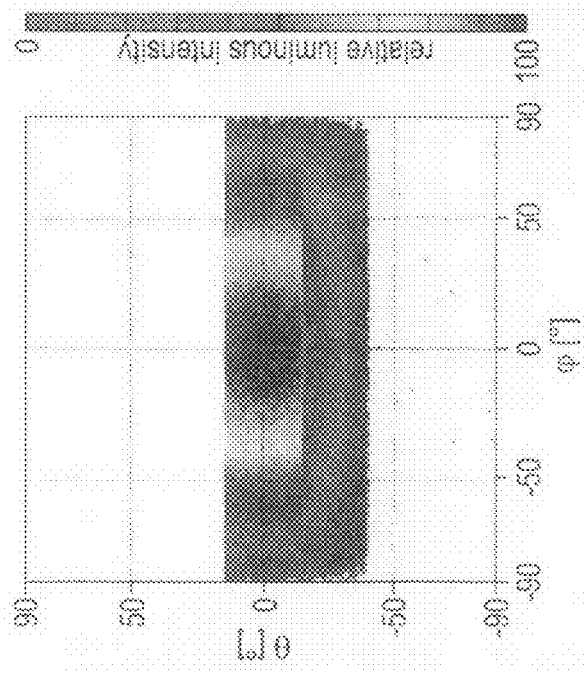
FIG. 9B shows the relative luminous intensity of the illumination arrangement in accordance with the fourth exemplary embodiment.
Figure 9C:
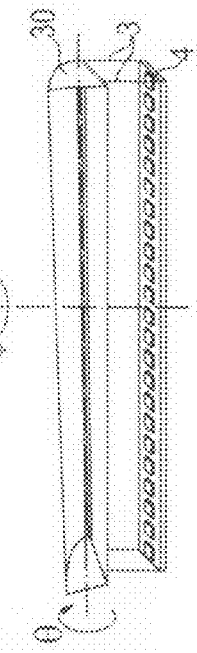
FIG. 9C shows a schematic perspective view of the illumination arrangement bringing about the relative illuminance and relative luminous intensity of FIGS. 9A and 9B, respectively.

This is illustrated again by way of example in FIGS. 9A, 9B and 9C. FIG. 9A shows the measured relative illuminance of the illumination arrangement 100 with beam shaping device 30, the angles defined $\phi$ and $\theta$ being defined in accordance with the rotated main emission direction, as shown FIG. 9C.

The relative luminous intensity of the illumination arrangement 100 is represented in arbitrary units in FIG. 9B. In the present case, the maximum luminous intensity is emitted at a viewing angle of $\phi=-4.5°$, $\theta=-4.5°$.

A large part of the light is emitted by the illumination arrangement 100 in accordance with the fourth exemplary embodiment in an angular range of $-15°\leq\theta\leq15°$. The illuminance distribution obtained is conFigured asymmetrically. While the relative illuminance falls steeply between $\theta=15°$ and $\theta=20°$, it decreases slowly at viewing directions where $\theta<0°$ in a range of between approximately $\theta=-15°$ and $\theta=-40°$.

Figure 10A:
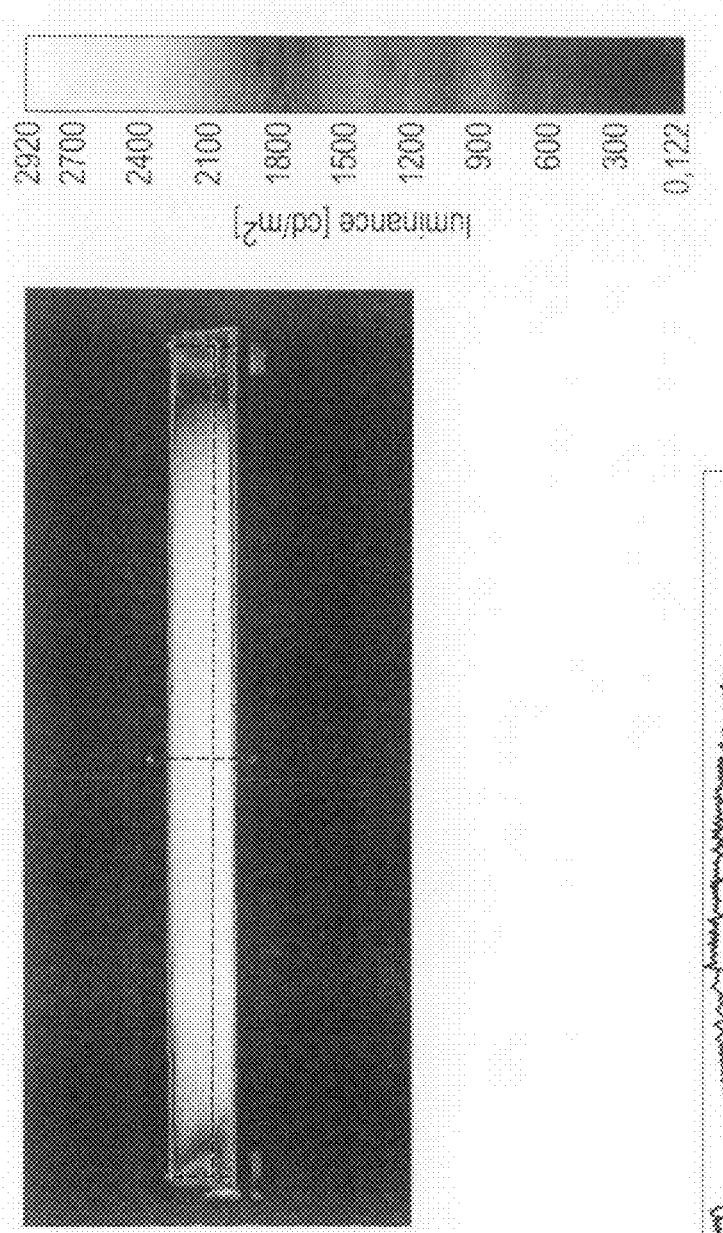
FIG. 10A shows a grey scale representation of the luminance of the illumination arrangement in accordance with the fourth exemplary embodiment.
Figure 10B:
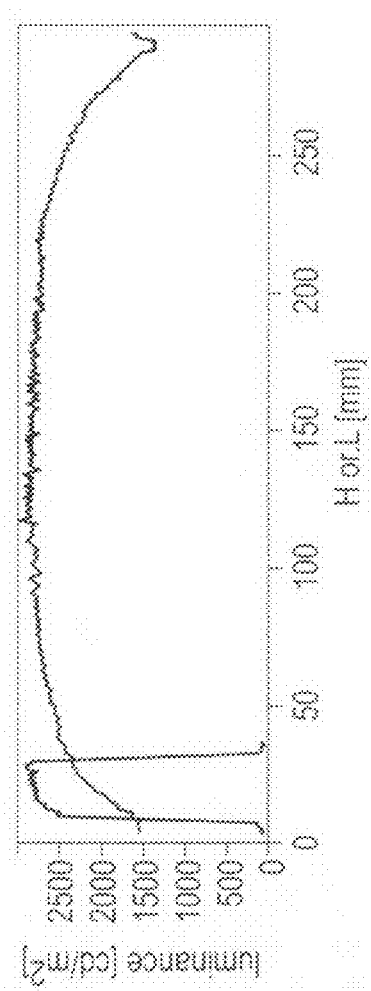
FIG. 10B shows the luminance of the illumination arrangement along the dashed lines crossing the center of FIG. 10A.

The luminance of the illumination arrangement 100 in accordance with the fourth exemplary embodiment is represented by way of example in a plan view of the second longitudinal side face 3' in FIGS. 10A and 10B. The gray scale representation of FIG. 10A and the cross sections along the height H or the length L (FIG. 10B) show a high homogeneity of the luminance over a large partial region of the light-emitting zone of the illumination arrangement 100.

Figure 11:
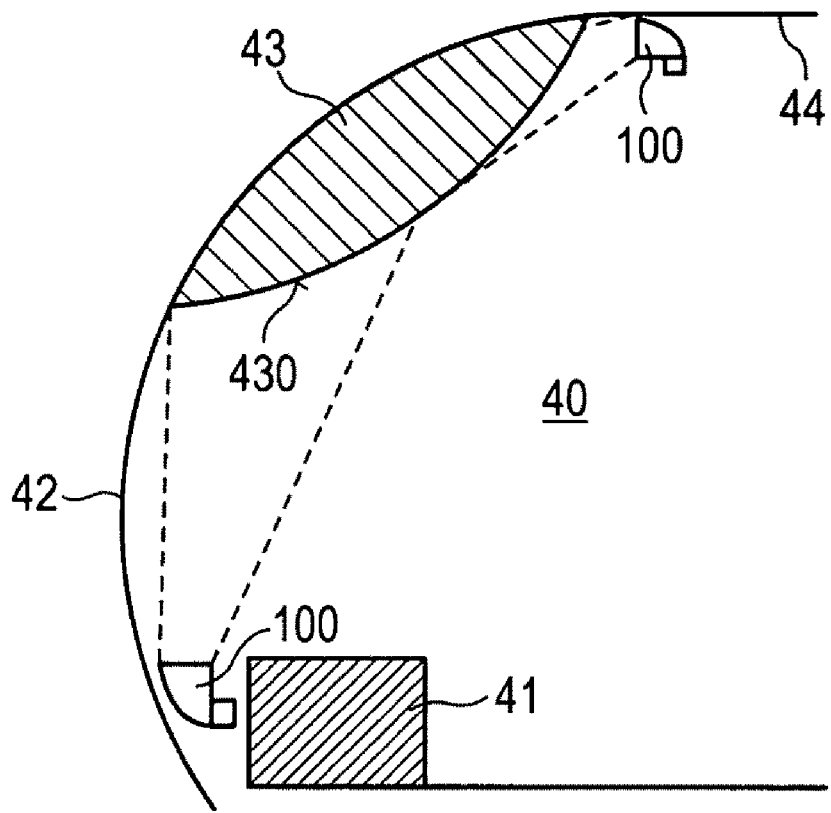
FIG. 11 shows the use of the illumination arrangement in accordance with the fourth exemplary embodiment for the interior illumination of a passenger cabin of an aircraft.

A use of the illumination arrangement 100 in accordance with the fourth exemplary embodiment for the illumination of an interior space 40 of an aircraft cabin is schematically illustrated in the cross section of FIG. 11. A light strip comprising a plurality of illumination arrangements 100 which are strung together in a longitudinal direction, that is to say in a direction of the row of the semiconductor components 1, is arranged between a row 41 of seats and an outer wall 42 of the aircraft cabin. The illumination arrangements 100 therefore constitute a multiple light module and illuminate at least one partial region of a wall 430 of a luggage flap 43. The interior space 40 of the aircraft cabin is illuminated indirectly as a result. In addition or as an alternative, a second illumination arrangement 100 or a second light strip comprising a plurality of illumination arrangements 100 strung together in a longitudinal direction can be arranged at a ceiling 44 of the transport means cabin. By way of example, the second illumination arrangement 100 likewise illuminates a partial region of the wall 430 of the luggage flap 43.

Figure 12:
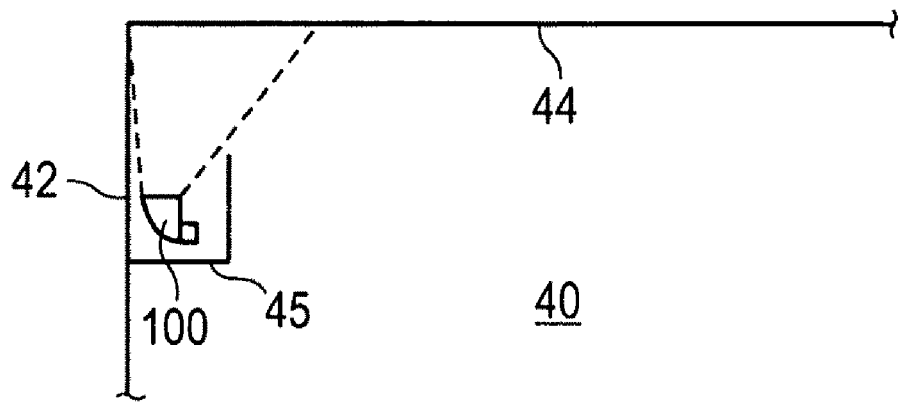
FIG. 12 shows the use of the illumination arrangement in accordance with the fourth exemplary embodiment for the interior illumination of a room in a building.

In a further use schematically illustrated in FIG. 12, the multiple light module is arranged at a wall 42 of a space in a building behind a screen 45 and illuminates the ceiling 44 of the space indirectly.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

I claim:

1. An illumination arrangement comprising:
    a plurality of light-emitting semiconductor components, arranged in a row;
    a diffuser which is illuminated by the light-emitting semiconductor components during operation of the illumination arrangement, scatters light emitted by the semiconductor components during operation and has a light coupling-out area remote from the semiconductor components; and
    two mutually opposite, reflective longitudinal side faces, between which the row of light-emitting semiconductor components is arranged, which run perpendicular or obliquely with respect to the light coupling-out area, and which reflect at least part of the light emitted by the light-emitting semiconductor components during operation in the direction toward the light coupling-out area;
    wherein at least one of the light-emitting semiconductor components has an optical device having a radiation exit area having a concavely curved partial region and a convexly curved partial region which at least partly surrounds the concavely curved partial region;
    wherein the reflectivity of at least one of the longitudinal side faces in an edge region of the illumination arrangement is lower than the reflectivity of the longitudinal side face in a central region of the illumination arrangement;
    in which the longitudinal side face is provided with an absorbent material or an absorbent material composition in the edge region, the absorbent material or the absorbent material composition is applied in the form of absorbent structural units, and the density of the absorbent structural units in the edge region decreases continuously or in stepped fashion in the direction toward the central region.

2. The illumination arrangement as claimed in claim 1, with an interior space in which the light-emitting semiconductor components are arranged, wherein the interior space is at least partially enclosed by the longitudinal side faces,
    two mutually opposite transverse side faces which run perpendicular or obliquely with respect to the longitudinal side faces,
    the diffuser, and
    a carrier opposite of the diffuser.

3. The illumination arrangement as claimed in claim 1, in which the longitudinal side faces are formed in diffusely reflective fashion.

4. The illumination arrangement as claimed in claim 1, in which the longitudinal side faces have a reflectance of 90% or more, preferably of 94% or more.

5. The illumination arrangement as claimed in claim 1, in which the optical device has an optical axis and the optical axis runs through the concavely curved partial region of the radiation exit area.

6. The illumination arrangement as claimed in claim 5, in which the radiation exit area is embodied rotationally symmetrically with respect to the optical axis.

7. The illumination arrangement as claimed in claim 1, which comprises a light-emitting semiconductor component which during operation, emits light having a spectral distribution which brings about a red, orange, yellow, green, blue or white color impression.

8. The illumination arrangement as claimed in claim 7, which comprises at least one group of four light-emitting semiconductor components succeeding one another along the row, one of the semiconductor components of the group in each case emitting red, green, blue and white light, respectively.

9. The illumination arrangement as claimed in claim 1, in which a first one of the light-emitting semiconductor components emits light having a first spectral distribution during operation, and a second one of the light-emitting semiconductor components, which is proximate to the first semiconductor component, emits light having a second spectral distribution, which is different from the first spectral distribution, during operation.

10. The illumination arrangement as claimed in claim 9, in which the diffuser intermixes light from a plurality of the light-emitting semiconductor components which emit light having different spectral distributions.

11. The illumination arrangement as claimed in claim 1, which has, at least one end of the row of light-emitting semiconductor components, a transverse side face which is illuminated during operation at least by the light-emitting semiconductor component arranged at the end of the row and which is intentionally formed such that it is absorbent for a light emitted by the semiconductor component.

12. The illumination arrangement as claimed in claim 11, in which the absorbent transverse side face reflects 30% or less, preferably 15% or less, particularly preferably 5% or less, of the light which is emitted by the semiconductor components and impinges on said side face.

13. The illumination arrangement as claimed in claim 11, comprising an absorber having the absorbent transverse side face, the absorber being produced from a black material or a black material composition or being provided with such a material/material composition.

14. The illumination arrangement as claimed in claim 11, in which the edge region contains the absorbent transverse side face.

15. The illumination arrangement as claimed in claim 1, in which the reflectivity of the longitudinal side face in the edge region increases continuously or in stepped fashion in the direction toward the central region.

16. The illumination arrangement as claimed in claim 1, in which one of the light-emitting semiconductor components is arranged in the edge region.

17. The illumination arrangement as claimed in claim 1, in which the value and/or the change of the reflectivity of the longitudinal side face in the edge region is matched to the luminous flux emitted by the semiconductor component(s) arranged in the edge region during operation.

18. The illumination arrangement as claimed in claim 1, in which the light emitted by the light coupling-out area has an at least approximately Lambertian intensity distribution.

19. The illumination arrangement as claimed in claim 1, in which the light emitted by the light coupling-out area is assigned a uniform chromaticity coordinate.

20. The illumination arrangement as claimed in claim 19, in which the chromaticity coordinate is adjustable.

21. The illumination arrangement as claimed in claim 1, which has a beam shaping device disposed downstream of the light coupling-out area.

22. The illumination arrangement as claimed in claim 21, in which the beam shaping device comprises a lens, a reflector, in particular a mirror, and/or a diffraction grating.

23. The illumination arrangement as claimed in claim 21, in which the beam shaping device has a cylinder- or cylinder-segment-shaped geometry, the center axis of the cylinder running in particular parallel to the light coupling-out area.

24. The illumination arrangement as claimed in claim 21, in which the beam shaping device alters the angular distribution of the radiation emitted by the light coupling-out area.

25. A multiple light module comprising a plurality of illumination arrangements as claimed in claim 1.

26. A luminaire comprising an illumination arrangement as claimed in claim 1.

27. The luminaire as claimed in claim 26, which constitutes a ceiling luminaire.

28. The luminaire as claimed in claim 26, which constitutes a spotlight.

29. The luminaire as claimed in claim 28, in which the spotlight is a floodlight, a table luminaire or a headlight.

30. The illumination arrangement as claimed in claim 1, configured to directly or indirectly illuminate a space.

31. The illumination arrangement as claimed in claim 30, wherein the illuminated space is the interior of a transport means, in particular of an aircraft cabin.

* * * * *